(12) United States Patent
Tanaka et al.

(10) Patent No.: US 10,256,323 B2
(45) Date of Patent: Apr. 9, 2019

(54) METHOD OF MANUFACTURING SEMICONDUCTOR DEVICE INCLUDING AN N TYPE SEMICONDUCTOR REGION FORMED IN A P TYPE SEMICONDUCTOR LAYER

(71) Applicant: Toyoda Gosei Co., Ltd., Kiyosu-shi (JP)

(72) Inventors: Nariaki Tanaka, Kiyosu (JP); Tohru Oka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/456,269

(22) Filed: Mar. 10, 2017

(65) Prior Publication Data

US 2017/0278950 A1 Sep. 28, 2017

(30) Foreign Application Priority Data

Mar. 24, 2016 (JP) ................................ 2016-059904

(51) Int. Cl.
*H01L 29/66* (2006.01)
*H01L 21/02* (2006.01)
(Continued)

(52) U.S. Cl.
CPC .... *H01L 29/66666* (2013.01); *H01L 21/0254* (2013.01); *H01L 21/02389* (2013.01);
(Continued)

(58) Field of Classification Search
CPC ......... H01L 21/26553; H01L 29/66522; H01L 21/3245; H01L 29/2003; H01L 29/66666
See application file for complete search history.

(56) References Cited

U.S. PATENT DOCUMENTS 5,910,669 A 6/1999 Chang et al.
2003/0209185 A1 11/2003 Ueno et al.
(Continued)

FOREIGN PATENT DOCUMENTS

JP H06-224437 A 8/1994
JP 2001-267570 A 9/2001
(Continued)

OTHER PUBLICATIONS

United States Office Acton dated Dec. 5, 2017 in co-pending U.S. Appl. No. 15/460,069.
(Continued)

*Primary Examiner* — Laura M Menz
*Assistant Examiner* — Candice Chan
(74) *Attorney, Agent, or Firm* — McGinn IP Law Group, PLLC

(57) ABSTRACT

A technique of improving the breakdown voltage of a semiconductor device is provided. There is provided a method of manufacturing a semiconductor device comprising a process of forming a p-type semiconductor layer that contains a p-type impurity and has a dislocation density of not higher than $1.0 \times 10^7$ cm$^{-2}$, on an n-type semiconductor layer that contains an n-type impurity and has a dislocation density of not higher than $1.0 \times 10^7$ cm$^{-2}$; an n-type semiconductor region forming process of forming an n-type semiconductor region in at least part of the p-type semiconductor layer by ion-implanting an n-type impurity into the p-type semiconductor layer and performing heat treatment to activate the ion-implanted n-type impurity; and a process of forming a trench that is recessed to pass through the p-type semiconductor layer and reach the n-type semiconductor layer. In the n-type semiconductor region forming process, a p-type impurity diffusion region in which the p-type impurity contained in the p-type semiconductor layer is
(Continued)

diffused is formed in at least part of the n-type semiconductor layer that is located below the n-type semiconductor region.

23 Claims, 11 Drawing Sheets

(51) Int. Cl.
| | |
|---|---|
| *H01L 21/285* | (2006.01) |
| *H01L 21/324* | (2006.01) |
| *H01L 29/10* | (2006.01) |
| *H01L 29/20* | (2006.01) |
| *H01L 29/423* | (2006.01) |
| *H01L 29/78* | (2006.01) |
| *H01L 21/265* | (2006.01) |

(52) U.S. Cl.
CPC .. *H01L 21/26553* (2013.01); *H01L 21/28587* (2013.01); *H01L 21/3245* (2013.01); *H01L 29/1033* (2013.01); *H01L 29/2003* (2013.01); *H01L 29/4236* (2013.01); *H01L 29/66522* (2013.01); *H01L 29/7827* (2013.01)

(56) References Cited

U.S. PATENT DOCUMENTS

| | | |
|---|---|---|
| 2009/0179258 A1 | 7/2009 | Otake |
| 2009/0283776 A1 | 11/2009 | Iwamuro |
| 2012/0199889 A1 | 8/2012 | Miyamoto et al. |
| 2013/0214348 A1* | 8/2013 | Takeda ................ H01L 29/7827 257/330 |
| 2013/0285140 A1* | 10/2013 | Kagawa .............. H01L 29/7811 257/330 |
| 2014/0377942 A1 | 12/2014 | Noguchi et al. |

FOREIGN PATENT DOCUMENTS

| | | |
|---|---|---|
| JP | 2003-327497 A | 11/2003 |
| JP | 2009-038200 A | 2/2009 |
| JP | 2009-177110 A | 8/2009 |
| JP | 2010-239063 A | 10/2010 |
| JP | 2010-272729 A | 12/2010 |
| JP | WO 2011/024549 A1 | 3/2011 |
| JP | 5617175 B2 | 11/2014 |
| JP | 5682102 B2 | 3/2015 |
| JP | 2016-021460 A | 2/2016 |

OTHER PUBLICATIONS

United States Office Action dated May 11, 2018 in U.S. Appl. No. 15/460,069.
Japanese Office Action dated Feb. 5, 2019, in Japanese Patent Application No. 2016-059904 with an English translation.
Japanese Office Action dated Feb. 5, 2019, in Japanese Patent Application No. 2016-059903 with an English translation.

* cited by examiner

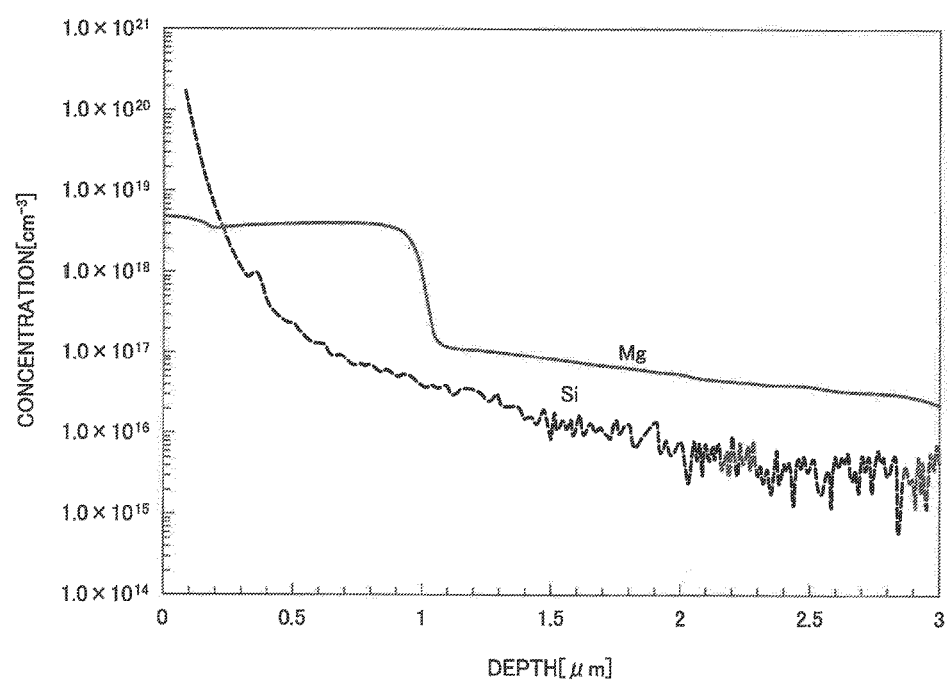

US 10,256,323 B2

METHOD OF MANUFACTURING SEMICONDUCTOR DEVICE INCLUDING AN N TYPE SEMICONDUCTOR REGION FORMED IN A P TYPE SEMICONDUCTOR LAYER

CROSS-REFERENCE TO RELATED APPLICATION

The present application claims priority from Japanese patent applications No. 2016-059904 filed on Mar. 24, 2016, the content of which is hereby incorporated by reference into this application.

BACKGROUND

Field

The disclosure relates to a method of manufacturing a semiconductor device, and a semiconductor device.

Related Art

A semiconductor device having a trench-type insulated structure has been known conventionally (as described in, for example, JP H06-224437A). In the methods disclosed in JP H06-224437A and JP 2001-267570A, a p-type semiconductor region is provided in the vicinity of the outer periphery of a bottom face of a trench by ion implantation, with a view to suppressing reduction of the breakdown voltage of the semiconductor device due to the potential crowding in the vicinity of the outer periphery of the bottom face of the trench.

For example, in a gallium nitride (GaN)-based semiconductor, however, there may be a difficulty in forming the p-type semiconductor region by ion implantation. There is accordingly a need for a technique that suppresses reduction of the breakdown voltage of the semiconductor device.

SUMMARY

In order to solve at least part of the problems described above, the disclosure may be implemented by aspects described below.

(1) According to one aspect of the invention, there is provided a method of manufacturing a semiconductor device. The method of manufacturing the semiconductor device comprises: a process of forming a p-type semiconductor layer that contains a p-type impurity and has a dislocation density of not higher than $1.0 \times 10^7$ cm$^{-2}$, on an n-type semiconductor layer that contains an n-type impurity and has a dislocation density of not higher than $1.0 \times 10^7$ cm$^{-2}$; an n-type semiconductor region forming process of forming an n-type semiconductor region in at least part of the p-type semiconductor layer by ion-implanting an n-type impurity into the p-type semiconductor layer and performing heat treatment to activate the ion-implanted n-type impurity; and a process of forming a trench that is recessed to pass through the p-type semiconductor layer and reach the n-type semiconductor layer, wherein in the n-type semiconductor region forming process, a p-type impurity diffusion region in which the p-type impurity contained in the p-type semiconductor layer is diffused is formed in at least part of the n-type semiconductor layer that is located below the n-type semiconductor region. The method of manufacturing the semiconductor device of this aspect forms the p-type impurity diffusion region in at least part of the n-type semiconductor layer in the n-type semiconductor region forming process. This suppresses the potential crowding in the vicinity of the outer periphery of the bottom face of the trench and improves the breakdown voltage of the semiconductor device.

(2) According to one embodiment of the method of manufacturing the semiconductor device, an average concentration of the p-type impurity in the n-type semiconductor layer may be $6.0 \times 10^{14}$ cm$^{-3}$ to $8.0 \times 10^{14}$ cm$^{-3}$ after the n-type semiconductor region forming process. The method of manufacturing the semiconductor device of this aspect further improves the breakdown voltage of the semiconductor device.

(3) According to one embodiment, the method of manufacturing the semiconductor device may further comprise a process of forming the n-type semiconductor layer on a substrate, wherein the substrate may be mainly made of a nitride semiconductor. The method of manufacturing the semiconductor device of this aspect improves the breakdown voltage of the semiconductor device.

(4) According to one embodiment of the method of manufacturing the semiconductor device, each of the n-type semiconductor layer and the p-type semiconductor layer may be mainly made of a nitride semiconductor. The method of manufacturing the semiconductor device of this aspect improves the breakdown voltage of the semiconductor device.

(5) According to one embodiment of the method of manufacturing the semiconductor device, the p-type impurity may include at least one selected from the group consisting of beryllium, magnesium, carbon and zinc. The method of manufacturing the semiconductor device of this aspect improves the breakdown voltage of the semiconductor device.

(6) According to one embodiment of the method of manufacturing the semiconductor device, the n-type impurity may include at least one selected from the group consisting of oxygen, silicon and germanium. The method of manufacturing the semiconductor device of this aspect improves the breakdown voltage of the semiconductor device.

(7) According to one embodiment of the method of manufacturing the semiconductor device, a temperature of the heat treatment may be not lower than 1000° C. and not higher than 1400° C. The method of manufacturing the semiconductor device of this aspect improves the breakdown voltage of the semiconductor device.

(8) According to one embodiment of the method of manufacturing the semiconductor device, a temperature of the heat treatment may be not lower than 1050° C. and not higher than 1250° C. The method of manufacturing the semiconductor device of this aspect improves the breakdown voltage of the semiconductor device.

(9) According to one embodiment of the method of manufacturing the semiconductor device, a time period of the heat treatment may be not shorter than 1 minute and not longer than 10 minutes. The method of manufacturing the semiconductor device of this aspect improves the breakdown voltage of the semiconductor device.

(10) According to one embodiment of the method of manufacturing the semiconductor device, a time period of the heat treatment may be not shorter than 1 minute and not longer than 5 minutes. The method of manufacturing the semiconductor device of this aspect improves the breakdown voltage of the semiconductor device.

(11) According to one embodiment of the method of manufacturing the semiconductor device, an average concentration of the n-type impurity from an ion-implanted face of the p-type semiconductor layer to a depth of 0.1 μm by the ion implantation may be not lower than $1.0 \times 10^{18}$ cm$^{-3}$. The method of manufacturing the semiconductor device of this aspect improves the breakdown voltage of the semiconductor device.

(12) According to one embodiment of the method of manufacturing the semiconductor device, an average concentration of the p-type impurity contained in the p-type semiconductor layer may be not lower than $5.0 \times 10^{17}$ cm$^{-3}$ and not higher than $5.0 \times 10^{18}$ cm$^{-3}$. The method of manufacturing the semiconductor device of this aspect improves the breakdown voltage of the semiconductor device.

(13) According to one embodiment of the method of manufacturing the semiconductor device, the p-type semiconductor layer may have a thickness of not less than 0.5 μm and not greater than 2.0 μm. The method of manufacturing the semiconductor device of this aspect improves the breakdown voltage of the semiconductor device.

(14) According to one embodiment of the method of manufacturing the semiconductor device, a ratio (Nd/Na) of an average concentration of n-type impurity Nd to an average concentration of p-type impurity Na in the p-type impurity diffusion region may be not greater than 20. The method of manufacturing the semiconductor device of this aspect improves the breakdown voltage of the semiconductor device.

(15) According to one embodiment of the method of manufacturing the semiconductor device, a ratio (Nd/Na) of an average concentration of n-type impurity Nd to an average concentration of p-type impurity Na in the p-type impurity diffusion region may be not lower than 1.6 and not higher than 13. The method of manufacturing the semiconductor device of this aspect improves the breakdown voltage of the semiconductor device.

(16) According to one embodiment of the method of manufacturing the semiconductor device, the substrate may be mainly made of a nitride semiconductor having a dislocation density of not higher than $5.0 \times 10^8$ cm$^{-2}$. The method of manufacturing the semiconductor device of this aspect improves the breakdown voltage of the semiconductor device.

(17) According to one embodiment, the method of manufacturing the semiconductor device may further comprise a process of forming an insulating film inside of the trench. The method of manufacturing the semiconductor device of this aspect improves the breakdown voltage of the semiconductor device.

(18) According to one embodiment, the method of manufacturing the semiconductor device may further comprise a process of forming a gate electrode on the insulating film. The method of manufacturing the semiconductor device of this aspect improves the breakdown voltage of the semiconductor device.

(19) According to one embodiment, the method of manufacturing the semiconductor device may further comprise a process of forming a drain electrode to be adjacent to and in contact with the substrate. The method of manufacturing the semiconductor device of this aspect improves the breakdown voltage of the semiconductor device.

(20) According to one embodiment, the method of manufacturing the semiconductor device may further comprise a process of forming a source electrode to be adjacent to and in contact with the n-type semiconductor region. The method of manufacturing the semiconductor device of this aspect improves the breakdown voltage of the semiconductor device.

(21) According to one embodiment, the method of manufacturing the semiconductor device may further comprise a process of forming a body electrode to be adjacent to and in contact with the p-type semiconductor layer. The method of manufacturing the semiconductor device of this aspect improves the breakdown voltage of the semiconductor device.

The disclosure may be implemented by any of various aspects other than the method of manufacturing the semiconductor device described above, for example, a semiconductor device manufactured by the method of manufacturing the semiconductor device described above or an apparatus of manufacturing a semiconductor device according to the manufacturing method described above.

The method of manufacturing the semiconductor device according to any one of the aspects described above forms the p-type impurity diffusion region in at least part of the n-type semiconductor layer in the n-type semiconductor region forming process. This suppresses the potential crowding in the vicinity of the outer periphery of the bottom face of the trench and improves the breakdown voltage of the semiconductor device.

BRIEF DESCRIPTION OF DRAWINGS

FIG. 14 is a diagram showing the results of the evaluation test.

DESCRIPTION OF EMBODIMENTS

A. First Embodiment

A-1. Structure of Semiconductor Device

Figure 1:
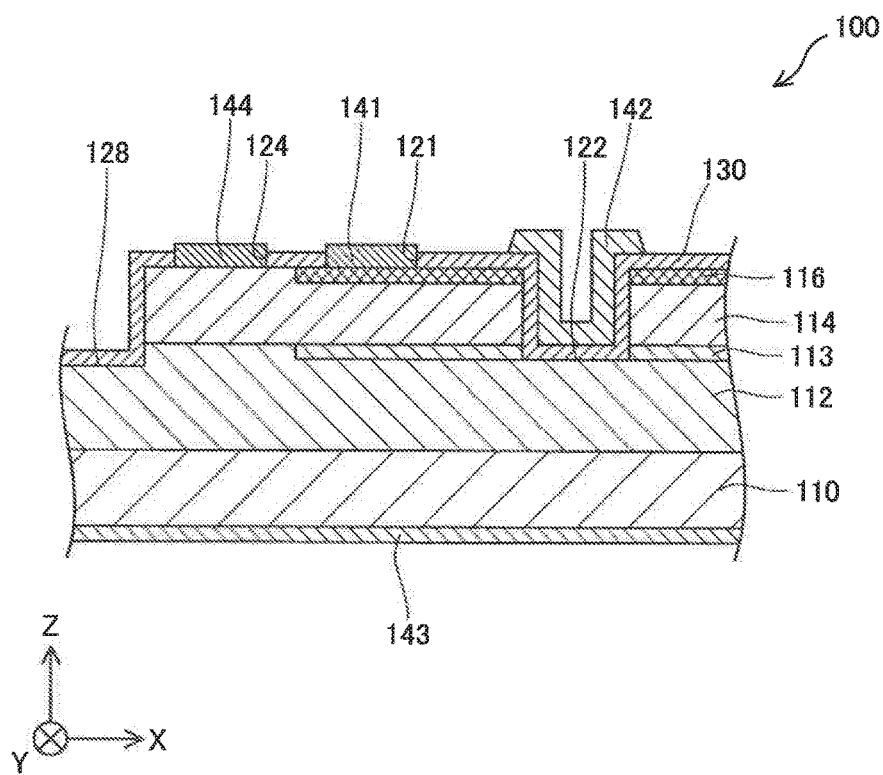
FIG. 1 is a sectional view schematically illustrating the structure of a semiconductor device according to a first embodiment.

FIG. 1 is a sectional view schematically illustrating the structure of a semiconductor device 100 according to a first embodiment. The semiconductor device 100 is a GaN-based semiconductor device formed by using gallium nitride (GaN). According to this embodiment, the semiconductor device 100 is a vertical trench MOSFET (metal-oxide-semiconductor field-effect transistor). According to this embodiment, the semiconductor device 100 is used for power control and is also called power device.

XYZ axes orthogonal to one another are illustrated in FIG. 1. Among the XYZ axes of FIG. 1, the X axis denotes a left-right axis on the sheet surface of FIG. 1. +X-axis direction denotes a rightward direction on the sheet surface, and −X-axis direction denotes a leftward direction on the sheet surface. Among the XYZ axes of FIG. 1, the Y axis denotes a front-back axis on the sheet surface of FIG. 1. +Y-axis direction denotes a backward direction on the sheet surface, and −Y-axis direction denotes a forward direction on the sheet surface. Among the XYZ axes of FIG. 1, the Z axis denotes a top-bottom axis on the sheet surface of FIG. 1. +Z-axis direction denotes an upward direction on the sheet surface, and −Z-axis direction denotes a downward direction on the sheet surface.

The semiconductor device 100 includes a substrate 110, an n-type semiconductor layer 112, a p-type semiconductor layer 114 and an n-type semiconductor region 116. The semiconductor device 100 further includes an insulating film 130, a source electrode 141, a body electrode 144, a gate electrode 142 and a drain electrode 143 and also has a trench 122 and a recess 128.

The substrate 110 of the semiconductor device 100 is a plate-like semiconductor extended along the X axis and the Y axis. It is preferable that the substrate 110 is mainly made of a nitride semiconductor having the dislocation density of not higher than $5.0 \times 10^6$ cm$^{-2}$. According to this embodiment, the substrate 110 is mainly made of gallium nitride (GaN) having the dislocation density of not higher than $1.0 \times 10^6$ cm$^{-2}$. The dislocation density of the substrate 110 is preferably not lower than 1.0 cm$^{-2}$, is more preferably not lower than $1.0 \times 10^2$ cm$^{-2}$ and is furthermore preferably not lower than $1.0 \times 10^4$ cm$^{-2}$. In the description hereof, the expression of "mainly made of X (for example, gallium nitride (GaN))" means containing X (for example, gallium nitride (GaN)) at 90% or higher molar fraction. According to this embodiment, the substrate 110 is an n-type semiconductor containing silicon (Si) as the donor element. According to this embodiment, the average concentration of silicon (Si) contained in the substrate 110 may be, for example, about $1 \times 10^{18}$ cm$^{-3}$.

The n-type semiconductor layer 112 of the semiconductor device 100 is a semiconductor layer that is located on a +Z-axis direction side of the substrate 110 and is extended along the X axis and the Y axis. The n-type semiconductor layer 112 is mainly made of a nitride semiconductor and is mainly made of gallium nitride (GaN) according to this embodiment. The dislocation density of the n-type semiconductor layer 112 is not higher than $1.0 \times 10^7$ cm$^{-2}$ and is preferably not higher than $5.0 \times 10^6$ cm$^{-2}$. According to this embodiment, the dislocation density of the n-type semiconductor layer 112 is not higher than $1.0 \times 10^6$ cm$^{-2}$. The dislocation density of the n-type semiconductor layer 112 is preferably not lower than 1.0 cm$^{-2}$, is more preferably not lower than $1.0 \times 10^2$ cm$^{-2}$ and is furthermore preferably not lower than $1.0 \times 10^4$ cm$^{-2}$. According to this embodiment, the n-type semiconductor layer 112 is an n-type semiconductor containing silicon (Si) as the donor element. According to this embodiment, the average concentration of silicon (Si) contained in the n-type semiconductor layer 112 may be, for example, about $1 \times 10^6$ cm$^{-3}$. According to this embodiment, the n-type semiconductor layer 112 is a layer formed on the substrate 110 by metal organic chemical vapor deposition (MOCVD). According to this embodiment, the thickness (length in the Z-axis direction) of the n-type semiconductor layer 112 may be, for example, about 10 μm (micrometer).

A p-type impurity diffusion region 113 of the semiconductor device 100 is at least a partial area on the +Z-axis direction side of the n-type semiconductor layer 112 and an area containing a p-type impurity. The p-type impurity diffusion region 113 is an area that is located below (on a −Z-axis direction side of) the n-type semiconductor region 116 and is formed in an n-type semiconductor region forming process described later. The term "below" herein means a location that is on the n-type semiconductor layer 112-side of the p-type semiconductor layer 114 with regard to the stacking direction of the n-type semiconductor layer 112 and the p-type semiconductor layer 114 (Z-axis direction). The p-type impurity diffusion region 113 is a semiconductor region that is extended along the X axis and the Y axis. According to this embodiment, the p-type impurity diffusion region 113 contains silicon (Si) and also contains magnesium (Mg). In terms of further improving the breakdown voltage of the semiconductor device 100, an average concentration of p-type impurity contained in the p-type impurity diffusion region 113 is preferably not lower than $3.0 \times 10^{14}$ cm$^{-3}$. In terms of further improving the breakdown voltage of the semiconductor device 100, a ratio (Nd/Na) of an average concentration of n-type impurity Nd to an average concentration of p-type impurity Na in the p-type impurity diffusion region 113 is preferably not higher than 20 and is more preferably not lower than 1.6 and not higher than 13.

The p-type semiconductor layer 114 of the semiconductor device 100 is a semiconductor layer that is located on the +Z-axis direction side of the n-type semiconductor layer 112 and is extended along the X axis and the Y axis. The p-type semiconductor layer 114 is mainly made of a nitride semiconductor and is mainly made of gallium nitride (GaN) according to this embodiment. The dislocation density of the p-type semiconductor layer 114 is not higher than $1.0 \times 10^7$ cm$^{-2}$ and is preferably not higher than $5.0 \times 10^6$ cm$^{-2}$. According to this embodiment, the dislocation density of the p-type semiconductor layer 114 is not higher than $1.0 \times 10^6$ cm$^{-2}$. The dislocation density of the p-type semiconductor layer 114 is preferably not lower than 1.0 cm$^{-2}$, is more preferably not lower than $1.0 \times 10^2$ cm$^{-2}$ and is furthermore preferably not lower than $1.0 \times 10^4$ cm$^{-2}$.

According to this embodiment, the p-type semiconductor layer 114 is a layer of a p-type semiconductor containing magnesium (Mg) as the acceptor element. The average concentration of magnesium (Mg) contained in the p-type semiconductor layer 114 is preferably not lower than $5.0 \times 10^{17}$ cm$^{-3}$ and not higher than $5.0 \times 10^{18}$ cm$^{-3}$, and may be, for example, $1.0 \times 10^{18}$ cm$^{-3}$ according to this embodiment. According to this embodiment, the p-type semiconductor layer 114 is a layer formed on the n-type semiconductor layer 112 by MOCVD. The thickness (length in the Z-axis direction) of the p-type semiconductor layer 114 is preferably not less than 0.5 μm in terms of operating the semiconductor device 100 more appropriately as a transistor and is also preferably not greater than 2.0 μm in terms of reducing the on-resistance of the semiconductor device 100 and may be, for example, about 1 μm according to this embodiment.

The n-type semiconductor region 116 of the semiconductor device 100 is a semiconductor region that is on the +Z-axis direction side of the p-type semiconductor layer 114 and is extended along the X axis and the Y axis. According to this embodiment, the n-type semiconductor region 116 is mainly made of gallium nitride (GaN). According to this embodiment, the n-type semiconductor region 116 is an n-type semiconductor containing silicon (Si) as the donor element. According to this embodiment, the n-type semiconductor region 116 is an area formed by ion implantation of silicon (Si) into part on the +Z-axis direction side of the p-type semiconductor layer 114.

The trench 122 of the semiconductor device 100 is a groove that is formed in the n-type semiconductor layer 112, the p-type semiconductor layer 114 and the n-type semiconductor region 116 and is recessed in the thickness direction (−Z-axis direction) of the n-type semiconductor layer 112. The trench 122 is formed from a +Z-axis direction side face of the n-type semiconductor region 116 to pass through the n-type semiconductor region 116 and the p-type semiconductor layer 114 and reach the n-type semiconductor layer 112. According to this embodiment, the trench 122 is formed by dry etching of the n-type semiconductor layer 112, the p-type semiconductor layer 114 and the n-type semiconductor region 116.

The recess 128 of the semiconductor device 100 is a groove that is formed in the p-type semiconductor layer 114 and the n-type semiconductor layer 112 and is recessed in the thickness direction (−Z-axis direction) of the n-type semiconductor layer 114. The recess 128 is formed from a +Z-axis direction side face of the p-type semiconductor layer 114 to pass through the p-type semiconductor layer 114 and reach the n-type semiconductor layer 112. The recess 128 is used to isolate the semiconductor device 100 from other elements formed on the substrate 110. According to this embodiment, the recess 128 is located on a −X-axis direction side of the n-type semiconductor region 116. According to this embodiment, the recess 128 is formed by dry etching of the p-type semiconductor layer 114 and the n-type semiconductor layer 112.

The insulating film 130 of the semiconductor device 100 is a film having electrical insulating characteristics. The insulating film 130 is formed from inside over to outside of the trench 122. According to this embodiment, the insulating film 130 is formed from inside of the trench 122 over to +Z-axis direction side faces of the p-type semiconductor layer 114 and the n-type semiconductor region 116 and to inside of the recess 128. According to this embodiment, the insulating film 130 is mainly made of silicon dioxide ($SiO_2$). According to this embodiment, the insulating film 130 is a film formed by atomic layer deposition (ALD).

The insulating film 130 has a contact hole 121 and a contact hole 124. The contact hole 121 is a through hole formed to pass through the insulating film 130 and reach the n-type semiconductor region 116. The contact hole 124 is a through hole formed to pass through the insulating film 130 and reach the p-type semiconductor layer 114. According to this embodiment, the contact holes 121 and 124 are formed by wet etching of the insulating film 130.

The source electrode 141 of the semiconductor device 100 is an electrode formed in the contact hole 121. The source electrode 141 is arranged to be in ohmic contact with the n-type semiconductor region 116. The ohmic contact herein denotes a contact that is different from Schottky contact and has a relatively low contact resistance. According to this embodiment, the source electrode 141 is an electrode formed by stacking a layer made of aluminum (Al) on a layer made of titanium (Ti) and performing annealing treatment (heat treatment) of the stacked layers.

The gate electrode 142 of the semiconductor device 100 is an electrode formed in the trench 122 via the insulating film 130. According to this embodiment, the gate electrode 142 is mainly made of aluminum (Al). When a voltage is applied to the gate electrode 142, an inversion layer is formed in the p-type semiconductor layer 114. This inversion layer serves as a channel, so that a conductive path is formed between the source electrode 141 and the drain electrode 143.

The drain electrode 143 of the semiconductor device 100 is an electrode formed on a −Z-axis direction side face of the substrate 110. The drain electrode 143 is arranged to be in ohmic contact with the substrate 110. According to this embodiment, the drain electrode 143 is an electrode formed by stacking a layer made of aluminum (Al) on a layer made of titanium (Ti) and performing annealing treatment (heat treatment) of the stacked layers.

The body electrode 144 of the semiconductor device 100 is an electrode formed in the contact hole 124. The body electrode 144 is arranged to be in ohmic contact with the p-type semiconductor layer 114. According to this embodiment, the body electrode 144 is mainly made of palladium (Pd).

A-2. Method of Manufacturing Semiconductor Device

Figure 2:
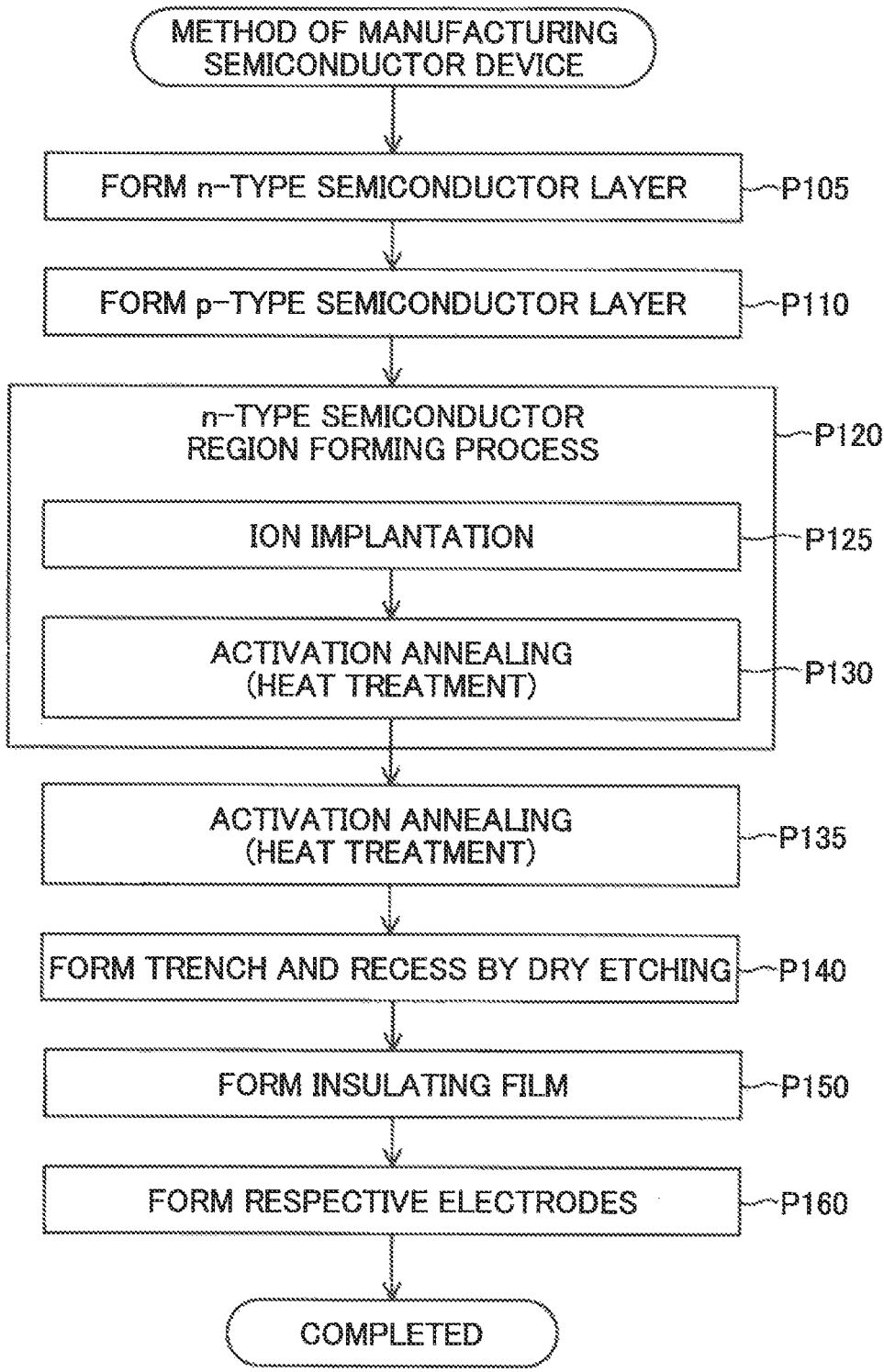
FIG. 2 is a process chart showing a method of manufacturing the semiconductor device according to the first embodiment.

FIG. 2 is a process chart showing a method of manufacturing the semiconductor device 100 according to the first embodiment. The manufacturer first provides the substrate 110. The substrate 110 is formed from a nitride semiconductor. According to this embodiment, the substrate 110 is an n-type semiconductor that is mainly made of gallium nitride (GaN) and contains silicon (Si) as the donor element.

The manufacturer subsequently forms the n-type semiconductor layer 112 on the substrate 110 (process P105) and then forms the p-type semiconductor layer 114 on the n-type semiconductor layer 112 (process P110). According to this embodiment, the manufacturer forms the n-type semiconductor layer 112 and the p-type semiconductor layer 114 by MOCVD based on crystal growth.

Figure 3:
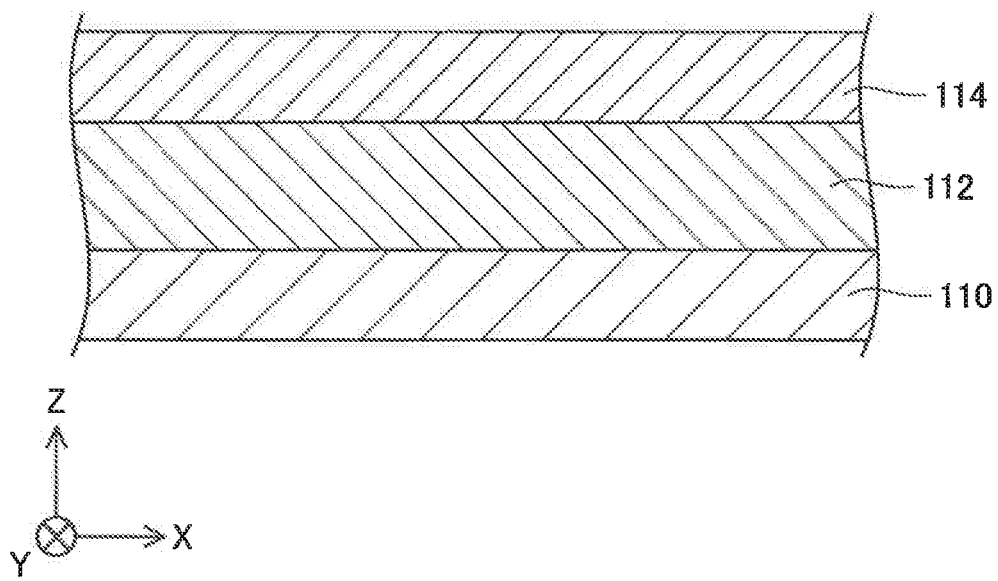
FIG. 3 is a sectional view schematically illustrating the state of a substrate after crystal growth.

FIG. 3 is a sectional view schematically illustrating the state of the substrate 110 after crystal growth. According to this embodiment, the n-type semiconductor layer 112 is an n-type semiconductor that is mainly made of gallium nitride (GaN) and contains silicon (Si) as the donor element. According to this embodiment, the p-type semiconductor layer 114 is a p-type semiconductor that is mainly made of gallium nitride (GaN) and contains magnesium (Mg) as the acceptor element. As shown in FIG. 3, the n-type semiconductor layer 112 is formed on the substrate 110, and the p-type semiconductor layer 114 is formed on the n-type semiconductor layer 112.

After forming the p-type semiconductor layer 114 (process P110 (shown in FIG. 2)), the manufacturer forms the n-type semiconductor region 116 in part of the p-type semiconductor layer 114 (process P120). The process P120 is also called n-type semiconductor region forming process. The n-type semiconductor region forming process (process P120) includes a process of ion implantation (process P125) and a process of heat treatment (process P130).

The manufacturer implants an n-type impurity from the upper side of the p-type semiconductor layer 114 by ion implantation (process P125). According to this embodiment, the manufacturer ion-implants silicon (Si) as the n-type impurity into the p-type semiconductor layer 114. More specifically, the manufacturer first forms a film 210 on the p-type semiconductor layer 114.

Figure 4:
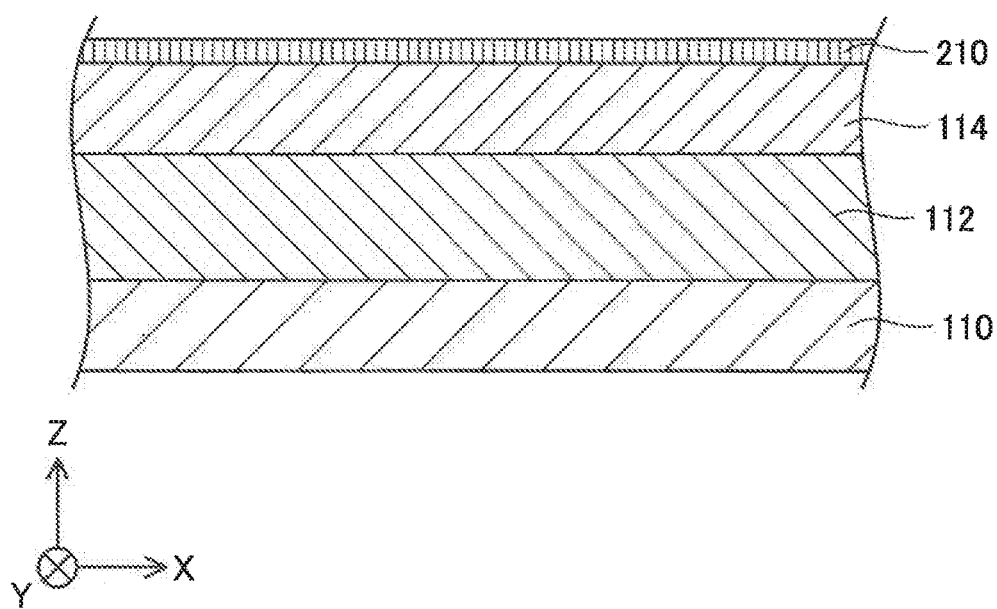
FIG. 4 is a sectional view schematically illustrating the state that a film is formed.

FIG. 4 is a sectional view schematically illustrating the state that the film 210 is formed. The film 210 is used to adjust a distribution of the impurity implanted by ion implantation in the p-type semiconductor layer 114. Accordingly the film 210 is used to gather the donor element implanted into the p-type semiconductor layer 114 to the vicinity of the surface of the p-type semiconductor layer 114. The film 210 also serves to protect the surface of the p-type semiconductor layer 114 from being damaged by ion implantation. According to this embodiment, a silicon dioxide ($SiO_2$) film of 30 nm in film thickness is used as the film 210. According to this embodiment, the manufacturer forms the film 210 by plasma CVD (chemical vapor deposition). The manufacturer subsequently forms a mask 220 on part of the film 210.

Figure 5:
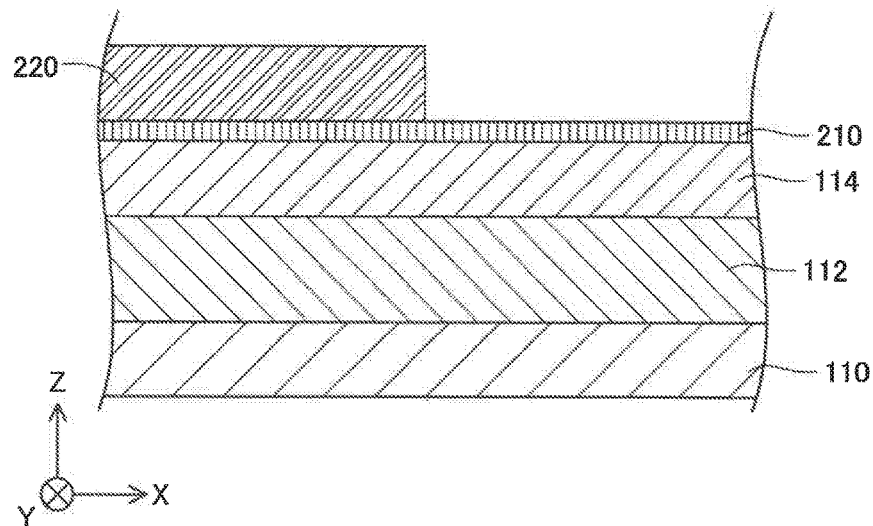
FIG. 5 is a sectional view schematically illustrating the state that a mask is formed.

FIG. 5 is a sectional view schematically illustrating the state that the mask 220 is formed. The mask 220 is formed on a non-implanted area of the p-type semiconductor layer 114 in which the donor element is not to be implanted. According to this embodiment, the manufacturer forms the mask 220 by using a photoresist. According to this embodiment, the mask 220 has a film thickness of about 2 µm.

The manufacturer subsequently ion-implants the n-type impurity from the upper side of the p-type semiconductor layer 114. According to this embodiment, the manufacturer ion-implants silicon (Si) into the p-type semiconductor layer 114. According to this embodiment, the total dose amount in the ion implantation is not less than $5 \times 10^{14}$ $cm^{-2}$. According to this embodiment, the manufacturer regulates the accelerating voltage in the ion implantation, such as to provide the silicon concentration of not lower than $1.0 \times 10^{18}$ $cm^{-3}$ in an area to the depth of 0.1 µm from a +Z-axis direction-side surface of the p-type semiconductor layer 114.

Figure 6:
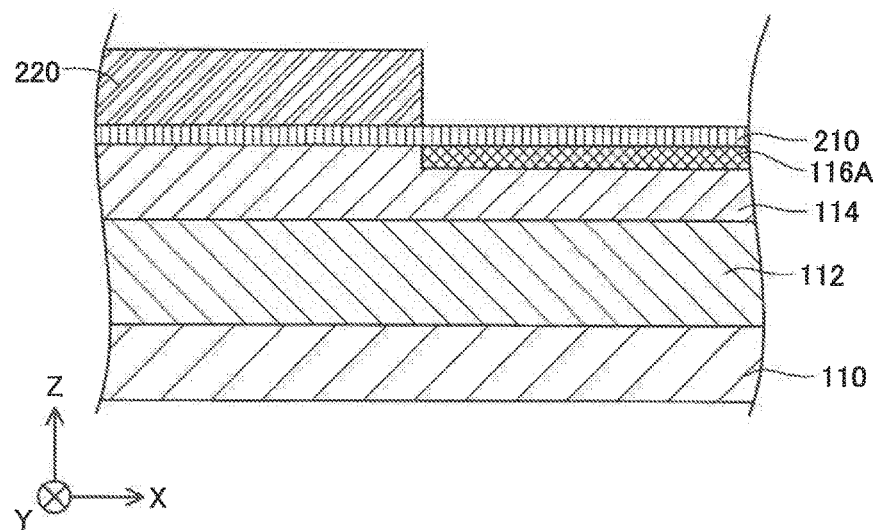
FIG. 6 is a sectional view schematically illustrating the state after ion implantation into a p-type semiconductor layer.

FIG. 6 is a sectional view schematically illustrating the state after ion implantation into the p-type semiconductor layer 114. The ion implantation forms an ion implanted region 116N as an area in which the donor element is implanted in the p-type semiconductor layer 114, below a non-covered portion of the film 210 that is not covered by the mask 220.

The concentration of the n-type impurity in the ion implanted region 116N may be adjusted to a desired concentration by regulating the material and the film thickness of the film 210 and regulating the accelerating voltage and the dose amount of ion implantation. It is preferable that the ion implantation provides the average concentration of the n-type impurity of not lower than $1.0 \times 10^{18}$ $cm^{-3}$ in an area to the depth of 0.1 µm from an ion-implanted surface (+Z-axis direction side face) of the p-type semiconductor layer 114. The ion implanted region 116N does not have n-type electrical conductivity since the implanted n-type impurity is not activated to serve as the donor element. Accordingly the ion implanted region 116N is an area of high resistance.

The manufacturer subsequently removes the film 210 and the mask 220 from the surfaces of the p-type semiconductor layer 114 and the ion implanted region 116A. According to this embodiment, the manufacturer removes the film 210 and the mask 220 by wet etching. This completes the ion implantation (process P125 (shown in FIG. 2)).

After the ion implantation (process P125), the manufacturer performs activation annealing (heat treatment) to activate the n-type impurity in the n-type semiconductor region 116 (process P130). In the process of activation annealing, the manufacturer heats the p-type semiconductor layer 114 and the ion implanted region 116A, so as to form the n-type semiconductor region 116 having the n-type electrical conductivity in the p-type semiconductor layer 114. The manufacturer first forms a cap film 240 on the p-type semiconductor layer 114 and the ion implanted region 116A.

Figure 7:
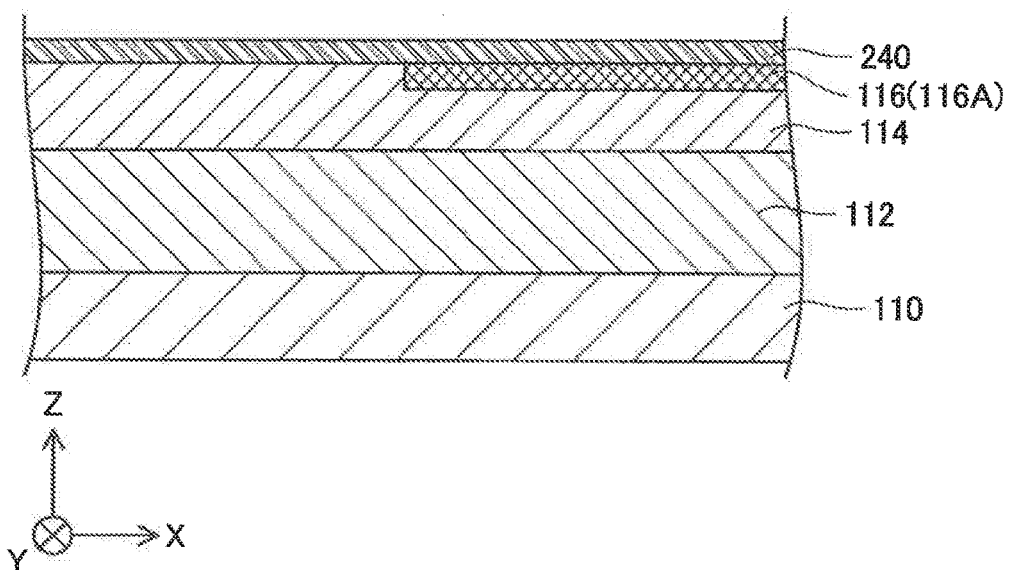
FIG. 7 is a sectional view schematically illustrating the state that a cap film is formed.

FIG. 7 is a sectional view schematically illustrating the state that the cap film 240 is formed. The cap film 240 serves to protect the surfaces of the p-type semiconductor layer 114 and the ion implanted region 116N from being damaged by heating. According to this embodiment, the manufacturer forms the cap film 240 by plasma CVD. According to this embodiment, the cap film 240 is mainly made of silicon nitrides (SiNx) and has a film thickness of about 50 nm.

The manufacturer subsequently heats the p-type semiconductor layer 114 and the ion implanted region 116N. In terms of further improving the breakdown voltage of the semiconductor device 100, the heating temperature of the p-type semiconductor layer 114 and the ion implanted region 116N is preferably not lower than 1000° C. and not higher than 1400° C. and is more preferably not lower than 1050° C. and not higher than 1250° C. In terms of further improving the breakdown voltage of the semiconductor device 100, the heating time is preferably not shorter than 1 minute and not longer than 10 minutes and is more preferably not shorter than 1 minute and not longer than 5 minutes. According to this embodiment, the manufacturer performs heat treatment under the following conditions:

<Conditions of Heat Treatment>
Atmosphere gas: nitrogen
Heating temperature: 1150° C.
Heating time: 4 minutes After the heat treatment, the manufacturer removes the cap film 240 from on the p-type semiconductor layer 114 and the ion implanted region 116A (i.e., the n-type semiconductor region 116). According to this embodiment, the manufacturer removes the cap film 240 by wet etching. This completes the activation annealing (process P130 (shown in FIG. 2)) and at the same time completes the n-type semiconductor region forming process (process P120).

Figure 8:
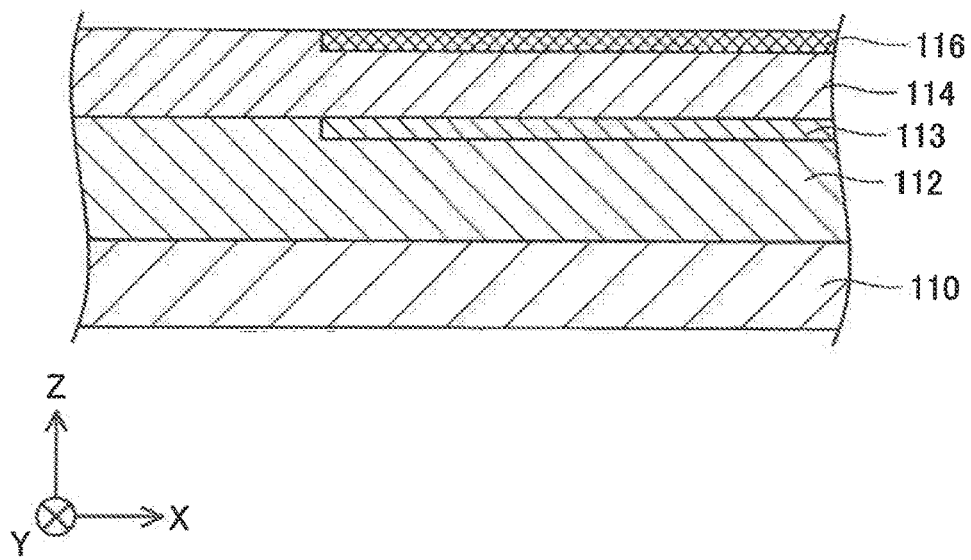
FIG. 8 is a sectional view schematically illustrating the state after completion of activation annealing.

FIG. 8 is a sectional view schematically illustrating the state after completion of the activation annealing (process P130). The activation annealing (process P130 (shown in FIG. 2)) changes the ion implanted region 116N to the n-type semiconductor region 116. The p-type impurity diffusion region 113 is formed in the area that is located below the n-type semiconductor region 116 and is on the +Z-axis direction side of the n-type semiconductor layer 112 by the ion implantation (process P125) and the heat treatment (process P130), i.e., by the n-type semiconductor region forming process (process P120). The p-type impurity diffusion region 113 is an area formed by diffusing the p-type impurity included in the p-type semiconductor layer 114 into the n-type semiconductor layer 112. The concentration of the p-type impurity included in the p-type impurity diffusion region 113 may be adjusted by regulating the accelerating voltage and the dose amount in the ion implantation and regulating the heating temperature and the heating time of the activation annealing. Especially increasing the accelerating voltage in the ion implantation increases the thickness (width in the Z-axis direction) of the n-type semiconductor region 116 and increases the concentration of the p-type impurity diffused in the p-type impurity diffusion region 113.

After the n-type semiconductor region forming process (process P120 (shown in FIG. 2)), the manufacturer performs activation annealing (heat treatment) to activate magnesium (Mg) in the p-type semiconductor layer 114 (process P135). According to this embodiment, the heat treatment is performed at 700° C. for 5 minutes in an atmosphere having the oxygen flow rate of 5% relative to the nitrogen flow rate. The conditions of heat treatment are, however, not specifically limited to these conditions. In another example, the heat treatment may be performed at 900° C. for 10 minutes in a nitrogen atmosphere that does not contain oxygen ($O_2$). The heat treatment for activating magnesium (Mg) in the p-type semiconductor layer 114 may be performed after formation of the p-type semiconductor layer 114 (process P110) and before the n-type semiconductor region forming process (process P120).

After the activation annealing (process P135), the manufacturer forms the trench 122 and the recess 128 by dry etching (process P140). More specifically, the manufacturer forms the trench 122 and the recess 128 to pass through the p-type semiconductor layer 114 and reach the n-type semiconductor layer 112. According to this embodiment, the manufacturer forms the trench 122 and the recess 127 by dry etching using a chlorine-based gas.

After forming the trench 122 and the recess 128 (process P140), the manufacturer forms the insulating film 130 inside of the trench 122 (process P150). According to this embodiment, the manufacturer forms the insulating film 130 on exposed +Z-axis direction-side surfaces of the p-type semiconductor layer 114 and the n-type semiconductor region 116 by ALD.

The manufacturer subsequently forms the source electrode 141, the body electrode 144, the gate electrode 142 and the drain electrode 143 (process P160). More specifically, the manufacturer forms the contact holes 121 and 124 (shown in FIG. 1) in the insulating film 130 by wet etching. The manufacturer subsequently forms the source electrode 141 in the contact hole 121 to be adjacent to and in contact with the n-type semiconductor region 116 and forms the body electrode 144 in the contact hole 124 to be adjacent to and in contact with the p-type semiconductor layer 114 in the same process. After forming the source electrode 141 and the body electrode 144, the manufacturer forms the gate electrode 142 on the insulating film 130 in the trench 122. After forming the gate electrode 142, the manufacturer forms the drain electrode 143 to be adjacent to and in contact with the substrate 110. The semiconductor device 100 is completed by the series of processes described above.

A-3. Advantageous Effects

The method of manufacturing the semiconductor device 100 according to the first embodiment forms the p-type impurity diffusion region 113 in the n-type semiconductor region forming process (process P120). This suppresses the potential crowding in the vicinity of the outer periphery of the bottom face of the trench 122. As a result, the method of manufacturing the semiconductor device 100 according to the first embodiment improves the breakdown voltage of the semiconductor device.

The following describes the relationship of the concentration of magnesium in the p-type impurity diffusion region 113 to improvement of the breakdown voltage of the semiconductor device 100. An increase in concentration of magnesium enhances suppression of the potential crowding on the bottom of the trench 122 and thereby improves the breakdown voltage of the semiconductor device 100. For example, (i) an increase in concentration of magnesium in the n-type semiconductor layer 112 from $3.0 \times 10^{14}$ $cm^{-3}$ to $8.0 \times 10^{14}$ $cm^{-3}$ increases the breakdown voltage of the semiconductor device 100 by approximately 100V, and (ii) an increase from $3.0 \times 10^{14}$ $cm^{-3}$ to $4.0 \times 10^{15}$ $cm^{-3}$ increases the breakdown voltage of the semiconductor device 100 by approximately 200V.

Under the condition that the concentration of silicon in the p-type impurity diffusion region 113 is $1.0 \times 10^{16}$ $cm^{-3}$, the concentration of magnesium of not higher than $4.0 \times 10^{15}$ $cm^{-3}$ in the p-type impurity diffusion region 113 maintains the n-type semiconductor layer 112 as the n-type and does not significantly vary the on-resistance of the semiconductor device 100. Under the same conditions, the concentration of magnesium of higher than $4.0 \times 10^{15}$ $cm^{-3}$ in the p-type impurity diffusion region 113, on the other hand, changes the n-type semiconductor layer 112 from the n-type to the p type and increases the on-resistance of the semiconductor device 100.

In the method of manufacturing the semiconductor device 100 according to this embodiment, the above n-type semiconductor region forming process (process P120) of the n-type semiconductor layer 112 and the p-type semiconductor layer 114 having the dislocation density of not higher than $1.0 \times 10^7$ $cm^{-2}$ provides a desirable concentration range of magnesium in the p-type impurity diffusion region 113 of the n-type semiconductor layer 112. Accordingly the method of manufacturing the semiconductor device 100 according to this embodiment improves the breakdown voltage of the semiconductor device 100, while maintaining the on-resistance of the semiconductor device 100 at a low level.

The following describes the results of an evaluation test supporting that the p-type impurity diffusion region is formed by the above n-type semiconductor region forming process (process P120) of stacked layers of the n-type semiconductor layer 112 having the dislocation density of not higher than $1.0 \times 10^7$ $cm^{-2}$ and the p-type semiconductor layer 114 having the dislocation density of not higher than $1.0 \times 10^7$ $cm^{-2}$.

B. Evaluation Test

Samples described below were used in the evaluation test. Samples 1 to 4 were Examples according to the embodiment of the present disclosure, and samples 5 and 6 were Comparative Examples. More specifically, the examiner first performed formation of the n-type semiconductor layer 112 (process P105) to the ion implantation (process P125) by the same method as that of the first embodiment. The examiner subsequently performed the heat treatment (process P130) with regard to the samples 1 to 4 (Examples). The examiner also provided the sample 5 (Comparative Example) without the heat treatment (process P130). Gallium nitride (GaN) substrates were used for the samples 1 to 5.

Figure 9:
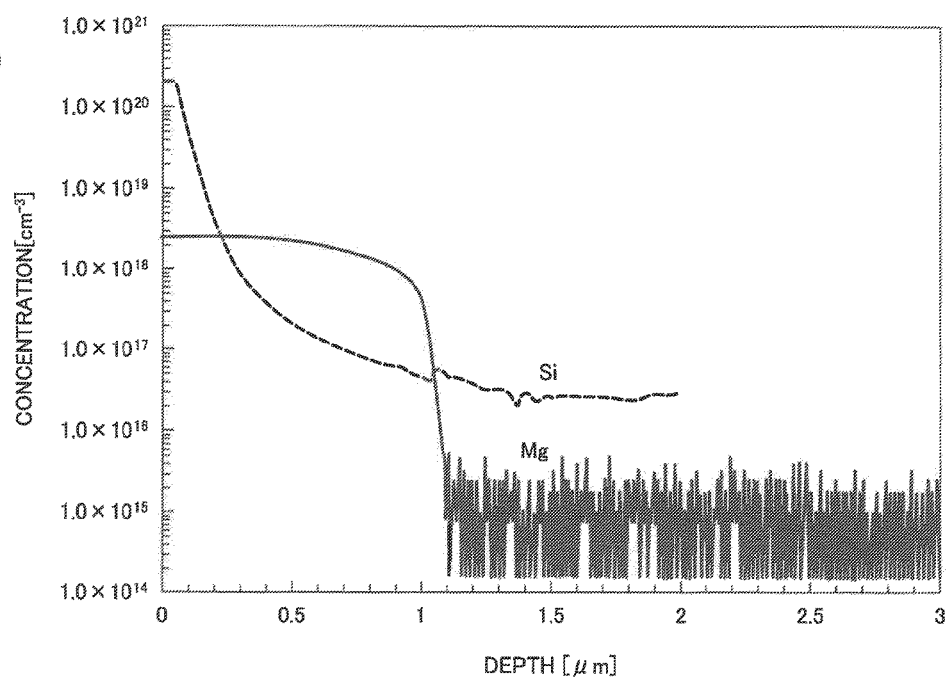
FIG. 9 is a diagram showing the results of an evaluation test.
Figure 10:
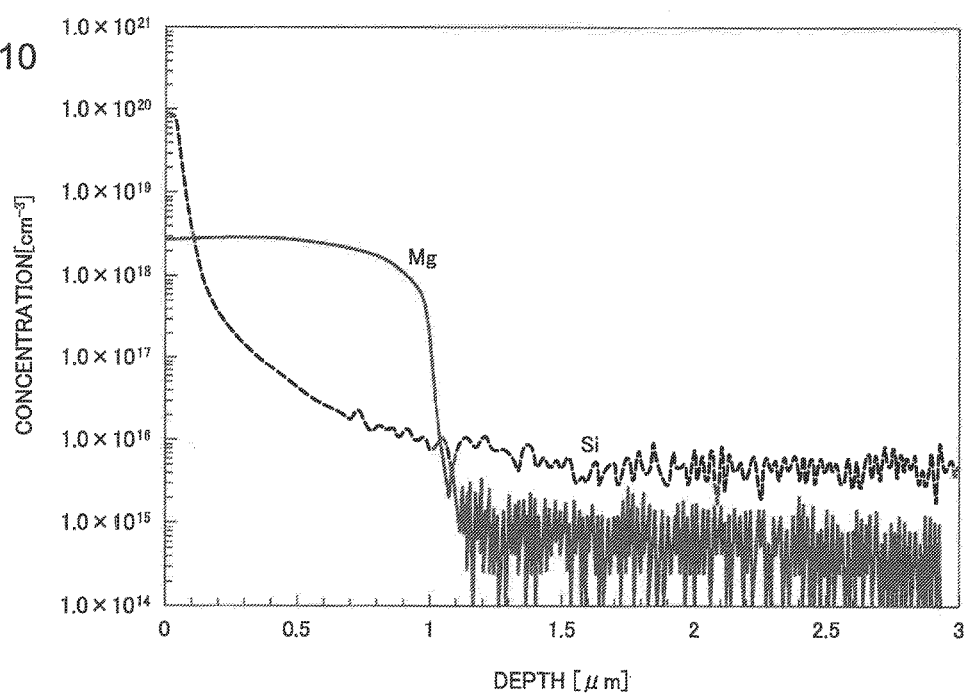
FIG. 10 is a diagram showing the results of the evaluation test.
Figure 11:
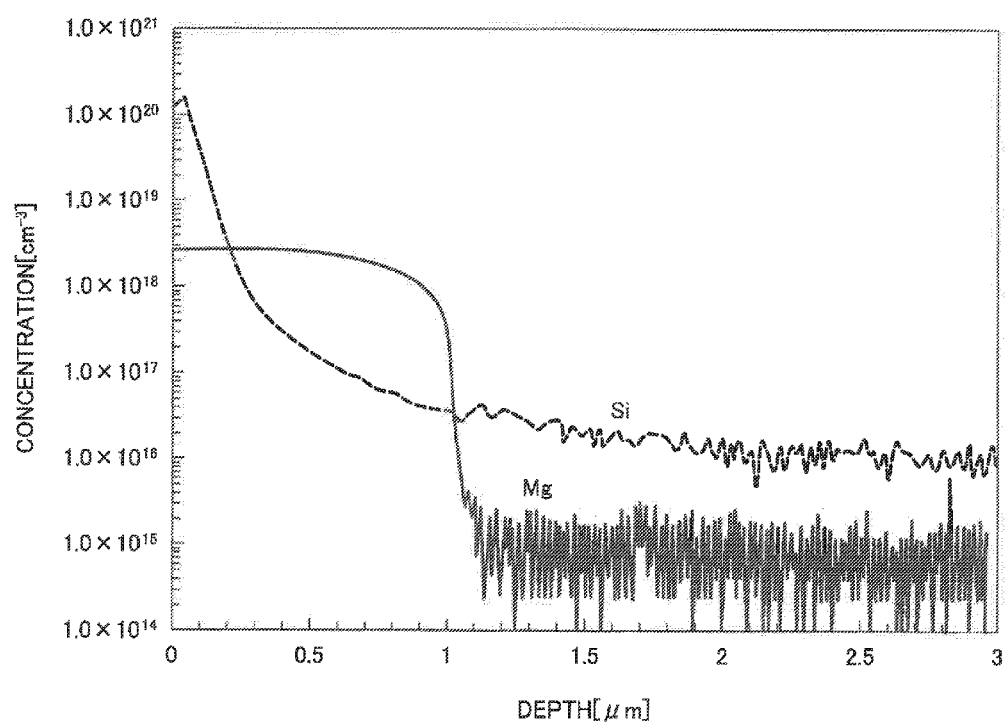
FIG. 11 is a diagram showing the results of the evaluation test.
Figure 12:
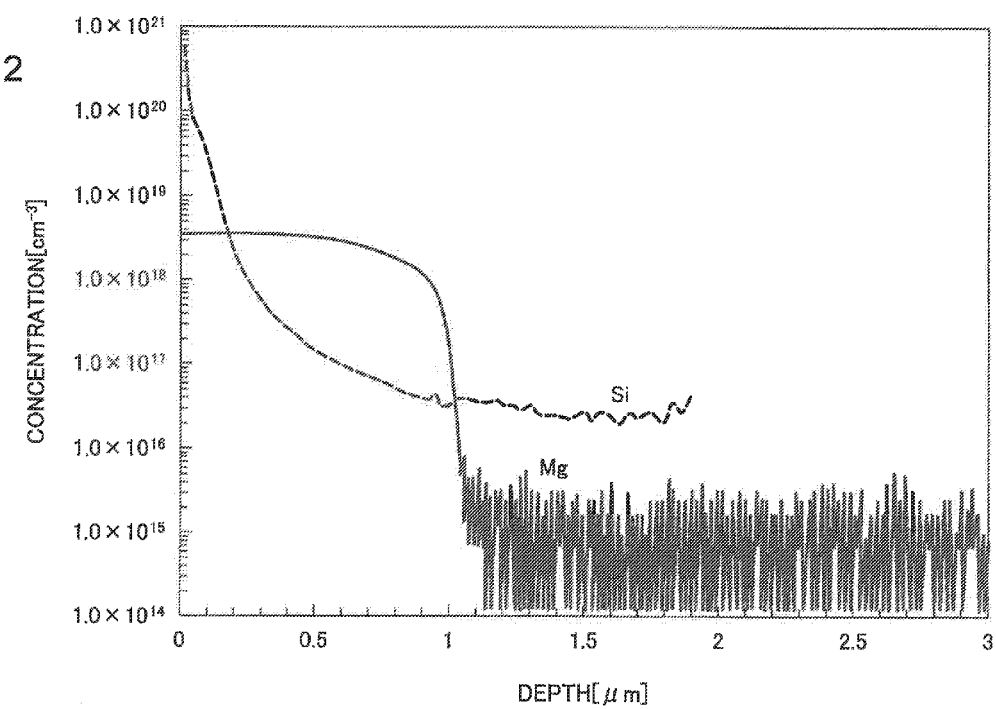
FIG. 12 is a diagram showing the results of the evaluation test.
Figure 13:
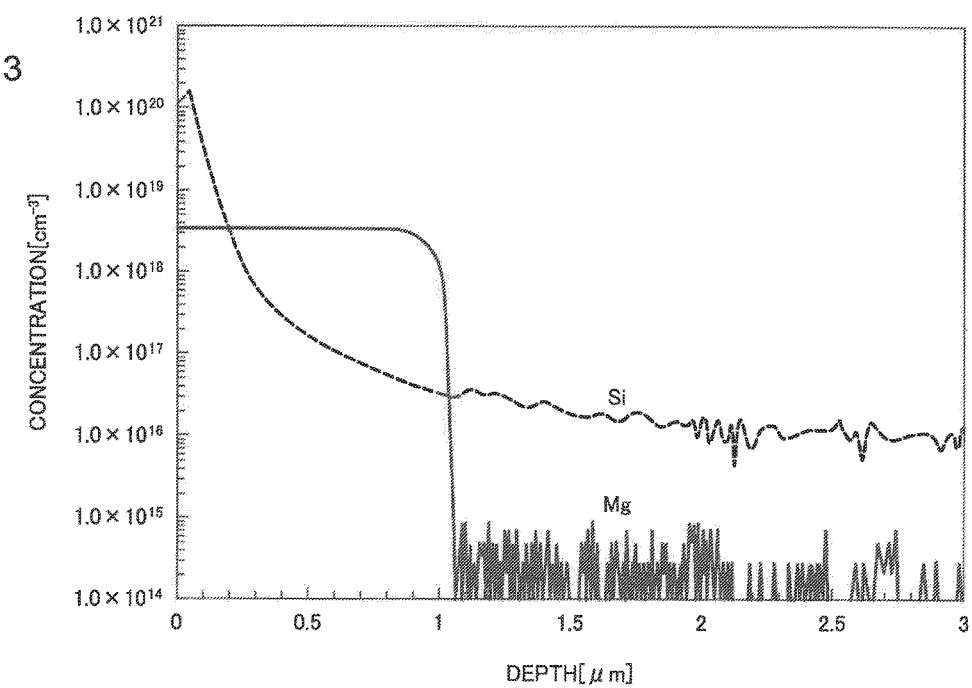
FIG. 13 is a diagram showing the results of the evaluation test.

The examiner also provided the sample 6 (Comparative Example) by forming an n-type semiconductor layer 112 and a p-type semiconductor layer 114 from gallium nitride (GaN) on a sapphire ($Al_2O_3$) substrate and subsequently performing the ion implantation (process P125) and the heat treatment (process P130). The dislocation densities of the n-type semiconductor layer 112 and the p-type semiconductor layer 114 of the sample 6 were both not higher than $1.0 \times 10^9$ $cm^{-2}$. The following shows the conditions of ion implantation and the conditions of heat treatment with regard to the samples 1 to 6:

<Conditions of ion implantation of sample 1>
  First Operation
    Accelerating voltage: 50 keV
    Dose amount: $1 \times 10^{15}$ $cm^{-2}$
  Second Operation
    Accelerating voltage: 100 keV
    Dose amount: $1 \times 10^5$ $cm^{-2}$
<Conditions of Heat Treatment of Sample 1>
  Atmosphere gas: nitrogen
  Heating temperature: 1150° C.
  Heating time: 2 minutes
<Conditions of Ion Implantation of Sample 2>
  Accelerating voltage: 50 keV
  Dose amount: $5 \times 10^{14}$ $cm^{-2}$
<Conditions of Heat Treatment of Sample 2>
  Atmosphere gas: nitrogen
  Heating temperature: 1150° C.
  Heating time: 2 minutes <Conditions of Ion Implantation of Sample 3>
  First Operation
    Accelerating voltage: 50 keV
    Dose amount: $5 \times 10^{14}$ cm$^{-2}$
  Second Operation
    Accelerating voltage: 100 keV
    Dose amount: $5 \times 10^{14}$ cm$^{-2}$
<Conditions of Heat Treatment of Sample 3>
  Atmosphere gas: nitrogen
  Heating temperature: 1150° C.
  Heating time: 2 minutes
<Conditions of Ion Implantation of Sample 4>
  First Operation
    Accelerating voltage: 50 keV
    Dose amount: $5 \times 10^{14}$ cm$^{-2}$
  Second Operation
    Accelerating voltage: 100 keV
    Dose amount: $5 \times 10^{14}$ cm$^{-2}$
<Conditions of Heat Treatment of Sample 4>
  Atmosphere gas: nitrogen
  Heating temperature: 1150° C.
  Heating time: 4 minutes
<Conditions of Ion Implantation of Sample 5>
  First Operation
    Accelerating voltage: 50 keV
    Dose amount: $5 \times 10^{14}$ cm$^{-2}$
  Second Operation
    Accelerating voltage: 100 keV
    Dose amount: $5 \times 10^{14}$ cm$^{-2}$
<Conditions of Ion Implantation of Sample 6>
  First Operation
    Accelerating voltage: 50 keV
    Dose amount: $1 \times 10^{15}$ cm$^{-2}$
  Second Operation
    Accelerating voltage: 100 keV
    Dose amount: $1 \times 10^{15}$ cm$^{-2}$
<Conditions of Heat Treatment of Sample 6>
  Atmosphere gas: nitrogen
  Heating temperature: 1150° C.
  Heating time: 2 minutes FIGS. 9 to 14 are diagrams showing the results of the evaluation test. FIG. 9 shows the results of evaluation of the sample 1, and FIG. 10 shows the results of evaluation of the sample 2. FIG. 11 shows the results of evaluation of the sample 3, and FIG. 12 shows the results of evaluation of the sample 4. FIG. 13 shows the results of evaluation of the sample 5, and FIG. 14 shows the results of evaluation of the sample 6.

FIGS. 9 to 14 show the measurement results of the impurity concentrations in the n-type semiconductor region 116, the p-type semiconductor layer 114 and the n-type semiconductor layer 112 of the respective samples by secondary ion mass spectrometry (SIMS). In FIGS. 9 to 14, the abscissa axis shows the depth (μm) in the −Z-axis direction of the n-type semiconductor region 116, the p-type semiconductor layer 114 and the n-type semiconductor layer 112, and the ordinate axis shows the concentrations (cm$^{-3}$) of silicon (Si) and magnesium (Mg). The depth of 0 μm indicates a +Z-axis direction-side surface of the n-type semiconductor region 116 (shown in FIG. 1).

As shown in FIGS. 9 to 14, an area at the depth of 0 μm to about 0.2 μm is an area having the higher concentration of silicon than the concentration of magnesium and is an area corresponding to the n-type semiconductor region 116. An area at the depth of about 0.2 μm to about 1.0 μm is an area having the higher concentration of magnesium than the concentration of silicon and is an area corresponding to the p-type semiconductor layer 114. An area at the depth of not less than about 1.0 μm is an area corresponding to the n-type semiconductor layer 112.

The results of FIGS. 9 to 12 with regard to the samples 1 to 4 (Examples) show that the concentration of magnesium is about $3.0 \times 10^{14}$ cm$^{-3}$ to about $1.0 \times 10^{16}$ cm$^{-3}$ in the n-type semiconductor layer 112. The results of FIGS. 9 to 12 with regard to the samples 1 to 4 (Examples) accordingly indicate diffusion of magnesium (Mg) into the n-type semiconductor layer 112. In other words, the area at the depth of not less than about 1.0 m is an area corresponding to the p-type impurity diffusion region 113 with regard to the samples 1 to 4 (Examples).

The average concentration of magnesium in the area of the sample 1 corresponding to the p-type impurity diffusion region 113 (shown in FIG. 9) is $8.0 \times 10^{14}$ cm$^{-3}$. The average concentration of magnesium in the area of the sample 2 corresponding to the p-type impurity diffusion region 113 (shown in FIG. 10) is $6.0 \times 10^{14}$ cm$^{-3}$. The average concentration of magnesium in the area of the sample 3 corresponding to the p-type impurity diffusion region 113 (shown in FIG. 11) is $7.0 \times 10^{14}$ cm$^{-3}$. The average concentration of magnesium in the area of the sample 4 corresponding to the p-type impurity diffusion region 113 (shown in FIG. 12) is $7.0 \times 10^{14}$ cm$^{-3}$.

According to the results of FIG. 13 with regard to the sample 5 (Comparative Example) without the heat treatment, the concentration of magnesium in the n-type semiconductor layer 112 is not higher than $3 \times 10^{14}$ cm$^{-3}$ that is the detection limit. The results of FIG. 13 with regard to the sample 5 (Comparative Example) accordingly indicate substantially no diffusion of magnesium (Mg). This shows that applying the conditions of the sample 5 to a semiconductor device does not improve the breakdown voltage of the semiconductor device.

According to the results of FIG. 14 with regard to the sample 6 (Comparative Example) having the dislocation density of not higher than not higher than $1.0 \times 10^9$ cm$^{-2}$, the average concentration of magnesium in the n-type semiconductor layer 112 is $6.0 \times 10^{16}$ cm$^{-3}$. This shows that applying the conditions of the sample 6 to a semiconductor device provides the high on-resistance of the semiconductor device, due to the reason described above.

The higher average concentration of magnesium in the area of the sample 3 corresponding to the p-type impurity diffusion region 113 (shown in FIG. 11) than the average concentration of magnesium in the area of the sample 2 corresponding to the p-type impurity diffusion region 113 (shown in FIG. 10) may be attributed to one additional operation of ion implantation in the sample 3 compared with the sample 2. The higher average concentration of magnesium in the area of the sample 1 corresponding to the p-type impurity diffusion region 113 (shown in FIG. 9) than the average concentration of magnesium in the area of the sample 3 corresponding to the p-type impurity diffusion region 113 (shown in FIG. 11) may be attributed to the larger dose amount in the ion implantation. As clearly understood from these results, the average concentration of magnesium in the area corresponding to the p-type impurity diffusion region 113 may be adjusted to a desired range, for example, by regulating the conditions in the ion implantation. Another technique employable to adjust the average concentration of magnesium in this area increases the concentration of magnesium in the p-type semiconductor layer 114. This is likely to increase the concentration of magnesium diffused from the p-type semiconductor layer 114 into the n-type semiconductor layer 112.

C. Other Embodiments

The disclosure is not limited to any of the embodiment, the examples and the modifications described above but may be implemented by a diversity of other configurations without departing from the scope of the disclosure. For example, the technical features of any of the embodiment, the examples and the modifications corresponding to the technical features of each of the aspects described in SUMMARY may be replaced or combined appropriately, in order to solve part or all of the problems described above or in order to achieve part or all of the advantageous effects described above. Any of the technical features may be omitted appropriately unless the technical feature is described as essential herein.

In the embodiment described above, the process of forming the trench 122 (process P140) is performed after the n-type semiconductor region forming process (process P120). The present disclosure is, however, not limited to this configuration. According to another embodiment, the process of forming the trench 122 (process P140) may be performed before the n-type semiconductor region forming process (process P120).

In the embodiment described above, magnesium (Mg) is used as the p-type impurity. In the present disclosure, however, this is not essential. The p-type impurity used may be, for example, beryllium (Be), carbon (C) or zinc (Zn).

In the embodiment described above, silicon (Si) is used as the n-type impurity. In the present disclosure, however, this is not essential. The n-type impurity used may be, for example, oxygen (O) or germanium (Ge).

In the embodiment described above, the material of the substrate and the respective semiconductor layers is not limited to gallium nitride (GaN) but may be, for example, silicon (Si), sapphire ($Al_2O_3$), gallium oxide ($Ga_2O_3$) or silicon carbide (SiC).

In the embodiment described above, the number of times of ion implantation (process P125) may be once, may be twice or may be three times or more. The conditions of ion implantation (for example, the accelerating voltage and the dose amount) may be adequately regulated according to the degree of implantation of the donor element.

In the embodiment described above, the material of the insulating film may be any material having electrical insulation properties. The material of the insulating film other than silicon dioxide ($SiO_2$) may be, for example, at least one of silicon nitrides (SiNx), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON). The insulating film may be a single layer structure or may be a two layer or more layer structure. The technique employed to form the insulating film is not limited to ALD but may be, for example, ECR sputtering or ECR-CVD.

In the embodiment described above, the materials used for the respective electrodes are not limited to the materials described in the above embodiment but may be other materials.

In the embodiment described above, the semiconductor device 100 includes the substrate 110 between the n-type semiconductor layer 112 and the drain electrode 143. The present disclosure is, however, not limited to this configuration. According to another embodiment, the semiconductor device 100 may not include the substrate 110 but may include the drain electrode 143 formed on a −Z-axis direction side face of the n-type semiconductor layer 112.

The invention claimed is:

1. A method of manufacturing a semiconductor device, comprising:
   a process of forming a p-type semiconductor layer that contains a p-type impurity and has a dislocation density of not higher than $1.0 \times 10^7$ cm$^{-2}$, on an n-type semiconductor layer that contains an n-type impurity and has a dislocation density of not higher than $1.0 \times 10^7$ cm$^{-2}$;
   an n-type semiconductor region forming process of forming an n-type semiconductor region in at least part of the p-type semiconductor layer by ion-implanting an n-type impurity into the p-type semiconductor layer and performing heat treatment to activate the ion-implanted n-type impurity; and
   a process of forming a trench that is recessed to pass through the p-type semiconductor layer and reach the n-type semiconductor layer, wherein
   in the performing of the heat treatment of the n-type semiconductor region forming process, a p-type impurity diffusion region formed in the n-type semiconductor layer and below the n-type semiconductor region.

2. The method of manufacturing the semiconductor device according to claim 1,
   wherein an average concentration of the p-type impurity in then-type semiconductor layer is $6.0 \times 10^{14}$ cm$^{-3}$ to $8.0 \times 10^{14}$ cm$^{-3}$ after the n-type semiconductor region forming process.

3. The method of manufacturing the semiconductor device according to claim 1, further comprising:
   a process of forming the n-type semiconductor layer on a substrate, wherein
   the substrate is mainly made of a nitride semiconductor.

4. The method of manufacturing the semiconductor device according to claim 1,
   wherein each of the n-type semiconductor layer and the p-type semiconductor layer is mainly made of a nitride semiconductor.

5. The method of manufacturing the semiconductor device according to claim 1,
   wherein the p-type impurity includes at least one selected from the group consisting of beryllium, magnesium, carbon and zinc.

6. The method of manufacturing the semiconductor device according to claim 1,
   wherein the n-type impurity includes at least one selected from the group consisting of oxygen, silicon and germanium.

7. The method of manufacturing the semiconductor device according to claim 1,
   wherein a temperature of the heat treatment is not lower than 1000° C. and not higher than 1400° C.

8. The method of manufacturing the semiconductor device according to claim 1,
   wherein a temperature of the heat treatment is not lower than 1050° C. and not higher than 1250° C.

9. The method of manufacturing the semiconductor device according to claim 1,
   wherein a time period of the heat treatment is not shorter than 1 minute and not longer than 10 minutes.

10. The method of manufacturing the semiconductor device according to claim 1, wherein a time period of the heat treatment is not shorter than 1 minute and not longer than 5 minutes.

11. The method of manufacturing the semiconductor device according to claim 1,
wherein an average concentration of the n-type impurity from an ion-implanted face of the p-type semiconductor layer to a depth of 0.1 μm by the ion implantation is not lower than $1.0 \times 10^{18}$ cm$^{-3}$.

12. The method of manufacturing the semiconductor device according to claim 1,
wherein an average concentration of the p-type impurity contained in the p-type semiconductor layer is not lower than $5.0 \times 10^{17}$ cm$^{-3}$ and not higher than $5.0 \times 10^{18}$ cm$^{-3}$.

13. The method of manufacturing the semiconductor device according to claim 1,
wherein the p-type semiconductor layer has a thickness of not less than 0.5 μm and not greater than 2.0 μm.

14. The method of manufacturing the semiconductor device according to claim 1,
wherein a ratio (Nd/Na) of an average concentration of n-type impurity Nd to an average concentration of p-type impurity Na in the p-type impurity diffusion region is not greater than 20.

15. The method of manufacturing the semiconductor device according to claim 1,
wherein a ratio (Nd/Na) of an average concentration of n-type impurity Nd to an average concentration of p-type impurity Na in the p-type impurity diffusion region is not lower than 1.6 and not higher than 13.

16. The method of manufacturing the semiconductor device according to claim 3,
wherein the substrate is mainly made of a nitride semiconductor having a dislocation density of not higher than $5.0 \times 10^6$ cm$^{-2}$.

17. The method of manufacturing the semiconductor device according to claim 1, further comprising:
a process of forming an insulating film inside of the trench.

18. The method of manufacturing the semiconductor device according to claim 17, further comprising:
a process of forming a gate electrode on the insulating film.

19. The method of manufacturing the semiconductor device according to claim 3, further comprising:
a process of forming a drain electrode to be adjacent to and in contact with the substrate.

20. The method of manufacturing the semiconductor device according to claim 1, further comprising:
a process of forming a source electrode to be adjacent to and in contact with the n-type semiconductor region.

21. The method of manufacturing the semiconductor device according to claim 1, further comprising:
a process of forming a body electrode to be adjacent to and in contact with the p-type semiconductor layer.

22. A method of manufacturing a semiconductor device, comprising:
forming a p-type semiconductor layer including a p-type impurity on an n-type semiconductor layer including an n-type impurity;
forming an n-type semiconductor region in the p-type semiconductor layer by ion-implanting an n-type impurity into the p-type semiconductor layer, and performing heat treatment to activate the ion-implanted n-type impurity;
during the performing of the heat treatment in the forming of the n-type semiconductor region, forming a p-type impurity diffusion region in the n-type semiconductor layer by diffusing the p-type impurity in the p-type semiconductor layer into the n-type semiconductor layer; and
forming a trench in the n-type semiconductor region, the p-type semiconductor layer and the p-type impurity diffusion region.

23. The method of manufacturing the semiconductor device according to claim 1, wherein the trench passes through the p-type impurity diffusion region and contacts the n-type semiconductor layer.

* * * * *